United States Patent [19]
Matsunuma et al.

[11] Patent Number: 5,993,258
[45] Date of Patent: Nov. 30, 1999

[54] ELECTRICAL CONNECTOR

[75] Inventors: Hiroyoshi Matsunuma; Sadao Kuboi; Sadao Ishizaki; Yasuyuki Mizunuma, all of Tokyo, Japan

[73] Assignee: DDK Ltd., Japan

[21] Appl. No.: 08/956,938

[22] Filed: Oct. 23, 1997

[30] Foreign Application Priority Data

Dec. 26, 1996 [JP] Japan ..................................... 8-357244

[51] Int. Cl.⁶ ............................................... H01R 13/648
[52] U.S. Cl. ............................................. 439/607; 439/79
[58] Field of Search ................................... 439/607–610, 439/79

[56] References Cited

U.S. PATENT DOCUMENTS

5,700,164  12/1997  Weidler et al. ......................... 439/607
5,738,544   4/1998  Davis ..................................... 439/607

*Primary Examiner*—Khiem Nguyen
*Attorney, Agent, or Firm*—Silverman, Cass & Singer, Ltd.

[57] ABSTRACT

An electrical connector includes a connector body to be mounted on a circuit board of an electrical appliance by means of protruding terminal legs of contacts incorporated in the connector body and by means of fixing legs of a shell as a worked body of a metallic plate forming an outer casing of the connector body. A mating connector socket of the shell is positioned so as to open outwardly of the electrical appliance. The shell has an auxiliary leg to be fixed to the circuit board. The auxiliary leg is formed by extension pieces extending from part of the shell on the side of the mating connector socket with respect to the fixing legs of the shell. The auxiliary leg serves to mount the electrical connector on the circuit board with great stability which is maintained for a long time.

5 Claims, 8 Drawing Sheets

FIG_1

ELECTRICAL CONNECTOR

BACKGROUND OF THE INVENTION

This invention relates to an electrical connector which is able to be mounted on a circuit board of an electrical appliance with great stability maintained for a long time.

Figure 6:
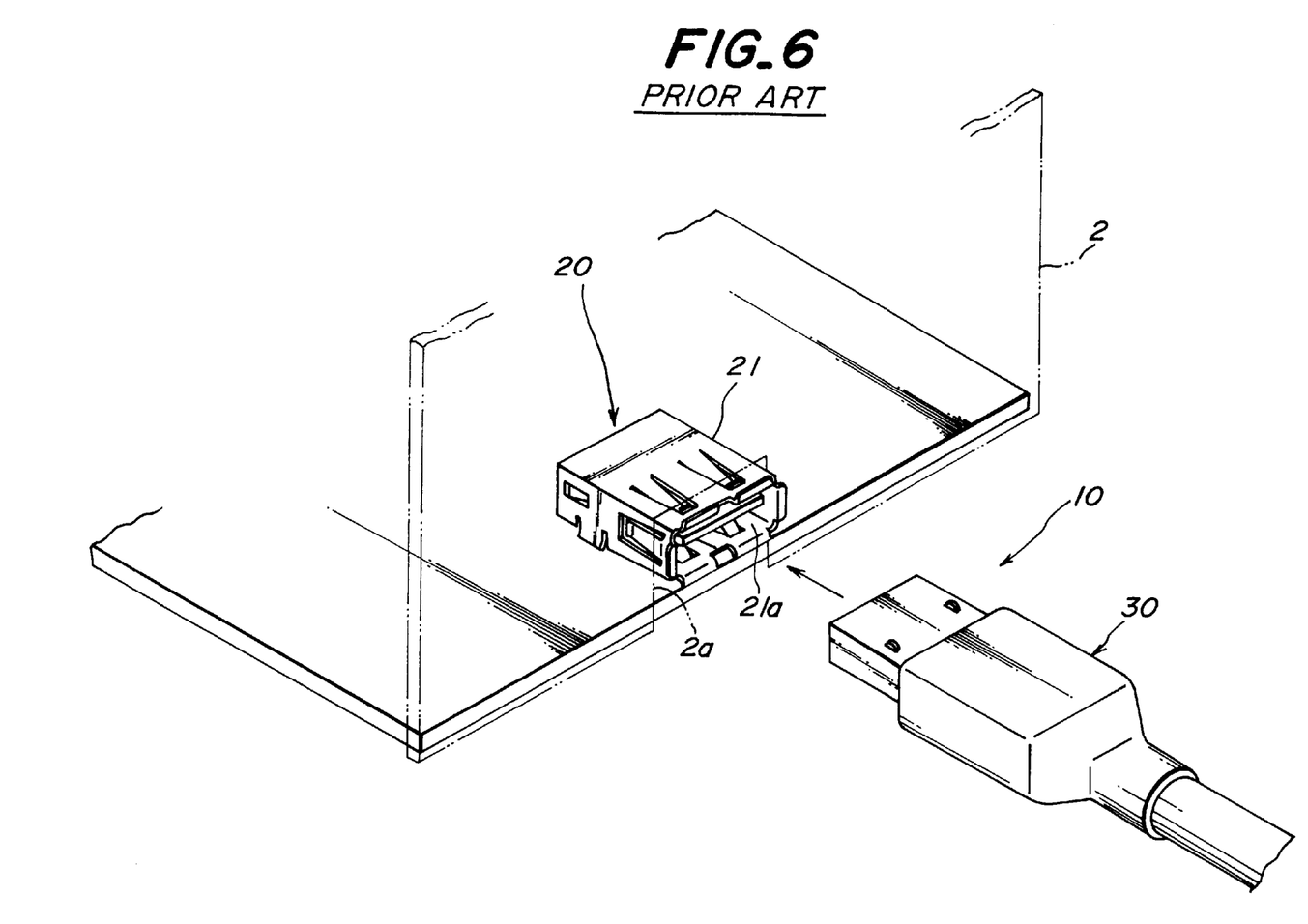
FIG. 6 is a partly removed perspective view illustrating the state of the electrical connector of the prior art secured to an electrical appliance.
Figure 7:
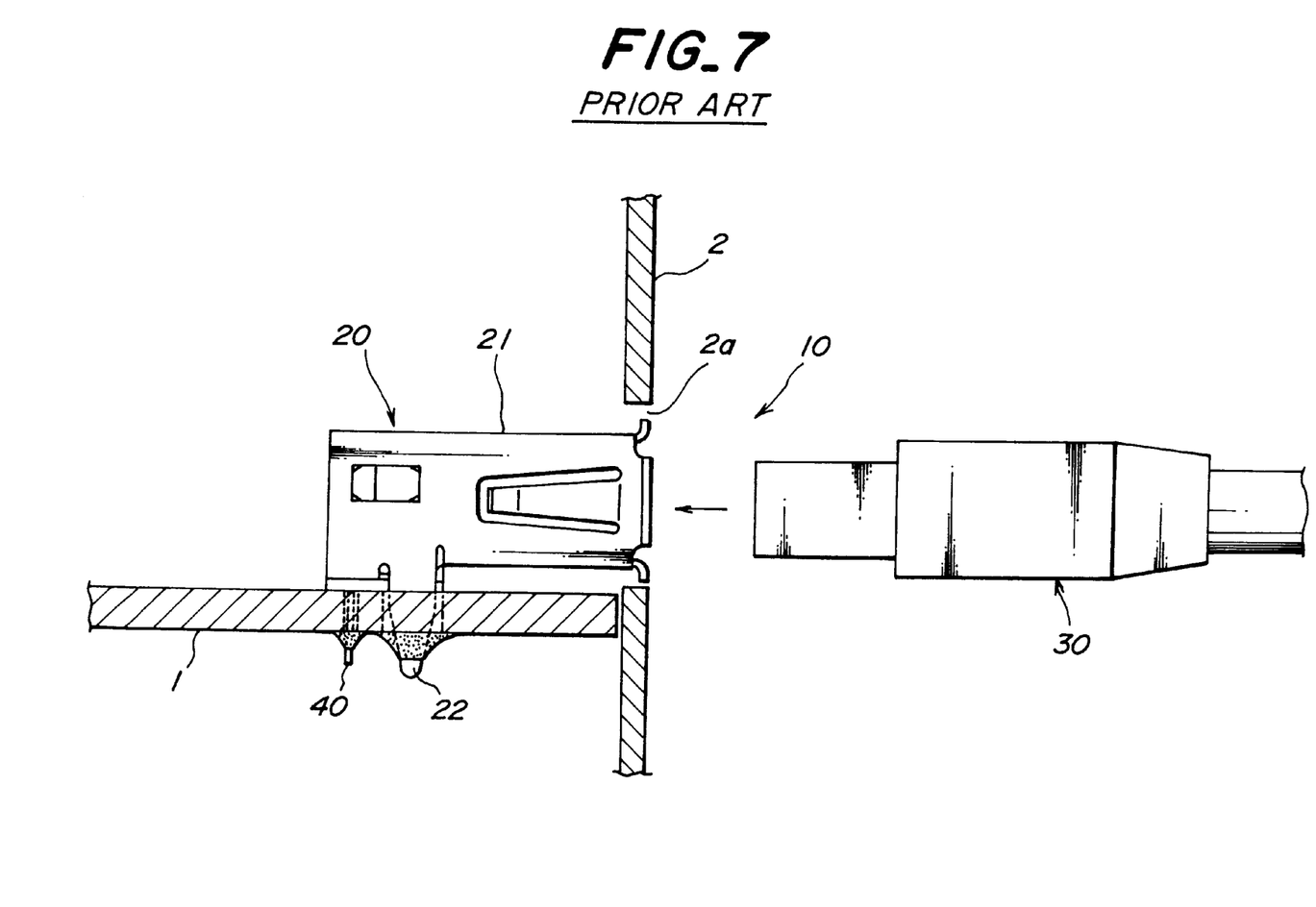
FIG. 7 is a partly longitudinal-sectional view illustrating the state of the electrical connector shown in FIG. 6 secured to an electrical appliance; and, FIG. 8 is an underneath perspective view of the electrical connector shown in FIG. 6.

With electrical or electronic appliances, for example, as shown in FIGS. 6 and 7, one connector body 20 of an electrical connector 10 is often mounted on a circuit board 1 arranged in an electrical appliance in a manner such that a mating connector socket 21a forming part of the shell 21 of the connector body 20 as its outer casing is positioned in a connector opening 2a formed in a panel plate 2 as part of a casing of the electrical appliance, thereby enabling a mating connector (plug) 30 to be inserted into the mating connector socket 21a of the shell 21.

Figure 8:
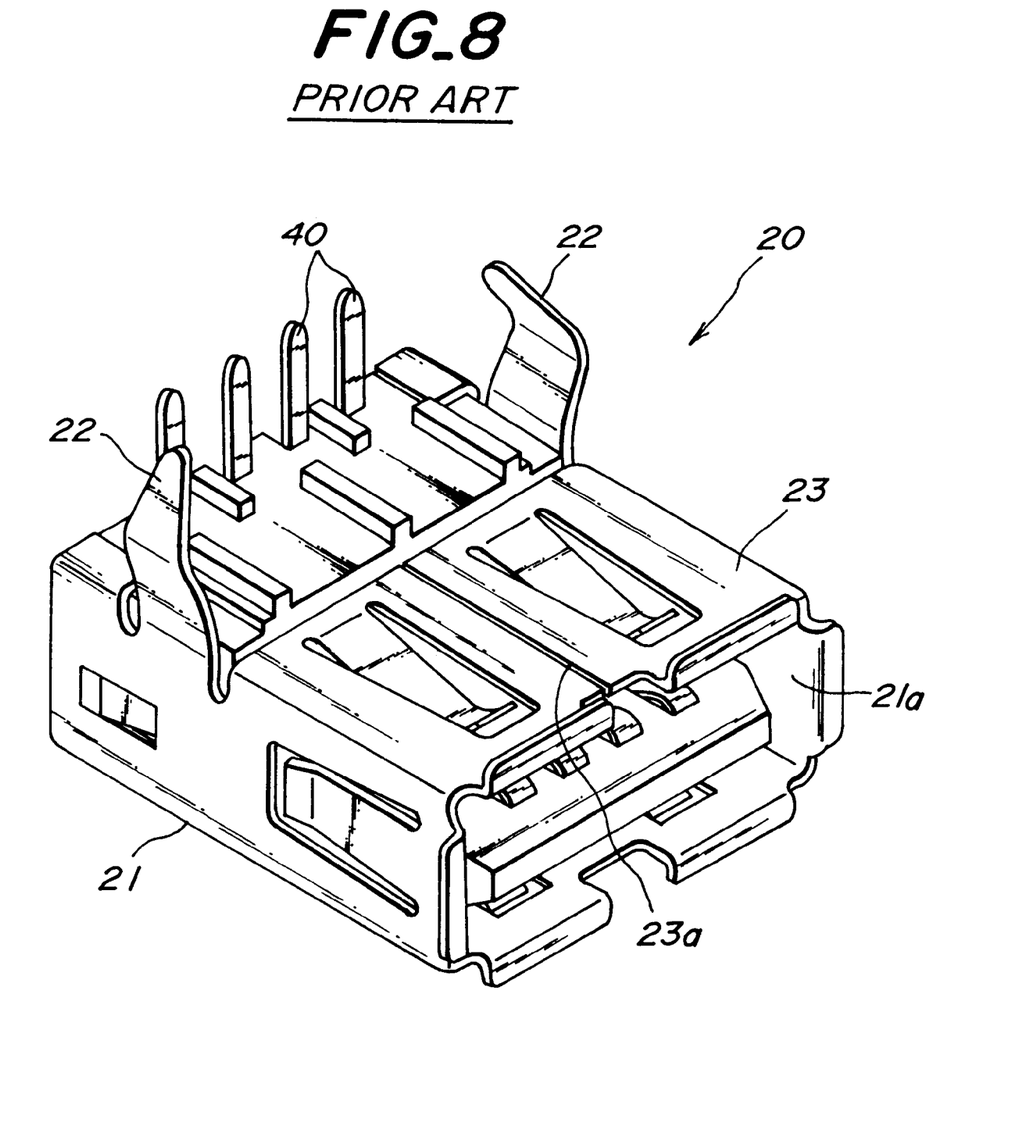

The connector body 20 is a resin-molded body having contacts arranged in its inside. The shell 21 forming the outer casing of the connector body 20 is a worked body made of a metallic plate, for example, a copper plate coated with nickel plating or solder layer, which is worked by punching and bending processes. The shell 21 is formed with fixing legs 22 extending from its bottom surface as shown in FIG. 8. In mounting the shell 21 onto the circuit board 1, the fixing legs 22 of the shell 21 and protruding terminal legs 40 of the contacts are inserted into predetermined fixing apertures (through-holes) and fixed thereat by soldering as shown in FIG. 7.

Such a soldering can simply be performed, for example, by moving along the surface of molten solder in a bath the circuit board 1 having the connector body 20 temporarily fixed thereto. This soldering method is effective owing to its high productivity and ensures the reliable fixation of a connector body 20 to the circuit board 1 substantially with a sufficient strength.

Therefore, even if the shell 21 of the connector body 20 is only positioned in and spaced from the connector opening 2a of the panel plate 2, no troubles occur in use, so long as the mating connector 30 is accurately inserted into the socket 21a of the shell 21 taking particular precautions.

However, problems will arise with any inaccurate insertion of the mating connector 30 into the socket 21a, for example, in oblique directions misaligned with the correct insertion axis in every direction, or mishandling insertion. With such cases, the shell 21 would be subjected to great loads (stresses).

When the shell 21 is subjected to such loads, the shell itself tends to deform so that the rectangular shape of the shell is distorted or the fixing legs 22 of the shell 21 are deformed and, in extreme cases, are broken. Once such deformations or distortions have occurred, they make it more difficult to insert the mating connector into the shell 21 and forced insertions are unavoidably repeated due to the difficulty of insertion, finally resulting into exchange of the connector body 20 itself for new one or even together with the circuit board.

In general, the shell 21 is a worked body made of a metallic plate which is worked by punching and bending processes as described above and is simply arranged over the outside of the resin-molded connector body 20 as by press-fitting. Therefore, on being subjected to undue forces thereon, the close contact between the shell 21 and the connector body 20 may be adversely affected and shell 21 itself may be deformed.

Particularly, with the shell 21 as shown in FIG. 8 having the mating connector socket 21a formed as a frame structure 23 in the form of a container by folding the metallic plate, including butt faces 23a at a center of the bottom surface, on being subjected to the undue forces the butt faces 23a abutting against each other will tend to open or separate from each other in many cases.

When the butt faces 23a of the frame structure 23 are opened or separated, the shielding effect of the shell itself and the grounding effect disappear and cause troubles such as delicate change in characteristics of the connector body 20. Moreover, the separation of the butt faces 23a of the frame structure 23 causes the mating connector socket 21a to widen or enlarge so that the mating connector 30 inserted in the socket 21a l becomes likely to be dislodged therefrom.

If the undue force acting upon the shell 21 cannot be sufficiently supported by it, great stresses are caused in the protruding terminal legs 40 of the contacts and the circuit board 1. As a result, there is a risk of failures such as cracks and peelings in printed circuits on the circuit board, connections between the connector body and the contacts, and other locations, which may finally cause malfunctionings and troubles of the appliance itself.

SUMMARY OF THE INVENTION

It is an object of the invention to provide an improved electrical connector which comprises, in addition to inherent fixing legs, an auxiliary leg provided on the shell of a connector body at a location nearer to the outside of an electrical appliance in which the electrical connector is mounted, that is to say, on the side of the mating connector socket of the shell with respect to the fixing legs in order to eliminate all the disadvantages of the prior art described above.

In order to accomplish this object, in an electrical connector including a connector body to be mounted on a circuit board of an electrical appliance by means of protruding terminal legs of contacts incorporated in said connector body and by means of fixing legs of a shell as a worked body of a metallic plate forming an outer casing of said connector body, a mating connector socket of said shell opening outwardly of the electrical appliance, according to the invention said shell comprises an auxiliary leg to be fixed to said circuit board, said auxiliary leg being formed by extension pieces extending from part of the shell on the side of said mating connector socket with respect to said fixing legs of the shell.

According to the second aspect of the invention, in an electrical connector including a connector body to be mounted on a circuit board of an electrical appliance by means of protruding terminal legs of contacts incorporated in said connector body and by means of fixing legs of a shell as a worked body of a metallic plate forming an outer casing of said connector body, a mating connector socket of said shell opening outwardly of the electrical appliance, said shell comprises an auxiliary leg to be fixed to said circuit board, said auxiliary leg being formed by two extension pieces extending from respective butt faces of the shell on the side of said mating connector socket with respect to said fixing legs of the shell.

According to the third aspect of the invention, in an electrical connector including a connector body to be mounted on a circuit board of an electrical appliance by means of protruding terminal legs of contacts incorporated in said connector body and by means of fixing legs of a shell as a worked body of a metallic plate forming an outer casing of said connector body, a mating connector socket of said shell opening outwardly of the electrical appliance, said shell comprises an auxiliary leg to be fixed to said circuit board, said auxiliary leg being formed by extension pieces extending from the proximity of butt faces of the shell on the side of said mating connector socket with respect to said fixing legs of the shell.

According to the forth aspect of the invention, in an electrical connector including a connector body to be mounted on a circuit board of an electrical appliance by means of protruding terminal legs of contacts incorporated in said connector body and by means of fixing legs of a shell as a worked body of a metallic plate forming an outer casing of said connector body, a mating connector socket of said shell opening outwardly of the electrical appliance, said two extension pieces extend from both the butt faces of the shell and arranged in symmetry with respect to said butt faces and in opposition to each other.

As can be seen from the above explanation, the electrical connector according to the invention has following significant advantages.

(1) First, as the shell of the connector body is provided with the auxiliary leg in addition to the inherent fixing legs, it is possible to fix the connector body to the circuit board rigidly and stably. As a result, a stable fixation of the connector body is obtained without any distortion of the rectangular shape of the shell itself and without any deformation and breakage of the fixing legs, even in case of any unsuitable inclined or mishandling insertion of the mating connector.

Therefore, no undue load acts upon the circuit board to which the connector body is attached. Even if unsuitable insertion of the mating connector such as the inclined insertion is repeated, the no-load condition on the circuit board considerably reduces the risk of failure such as cracks and peeling in connection between the circuit board and the connector body and in printed circuits themselves on the circuit board.

As any deformation of the shell and the others is prevented, repeated forced insertions due to deformation are not needed so that there is, of course, no failure requiring the exchange of the connector body and the circuit board. In short, the highly reliable electrical connector is obtained.

(2) As the auxiliary leg is situated on the side of the mating connector socket with respect to the fixing legs of the shell, the deformation of the mating connector socket is effectively prevented. Therefore, this ensures the stable insertion of the mating connector into the socket for a long time. There is no risk of the mating connector socket being widened or enlarged due to deformation, there cannot be unintentional dislodgment of the inserted connector body from the socket. As a result, the stable insertion of the mating connector in the socket is insured.

(3) Particularly, when the auxiliary leg is formed at butt faces or in the proximity of the butt faces of metal plate of the shell, the separation of the butt faces is effectively prevented. It is therefore possible to prevent the deformation (enlargement) of the mating connector socket and hence possible to maintain effectively the shielding effect and grounding effect of the shell of the connector body.

The invention will be more fully understood by referring to the following detailed specification and claims taken in connection with the appended drawings.

DESCRIPTION OF THE PREFERRED EMBODIMENTS

In general, a connector body of an electrical connector consists mainly of an electrical insulator, contacts held and fixed in the insulator, and a shell 21 arranged to cover the insulator. The electrical insulator is manufactured by the known injection molding method. The contacts and the shell are made of metallic materials and manufactured by the known press-working.

Figure 1:
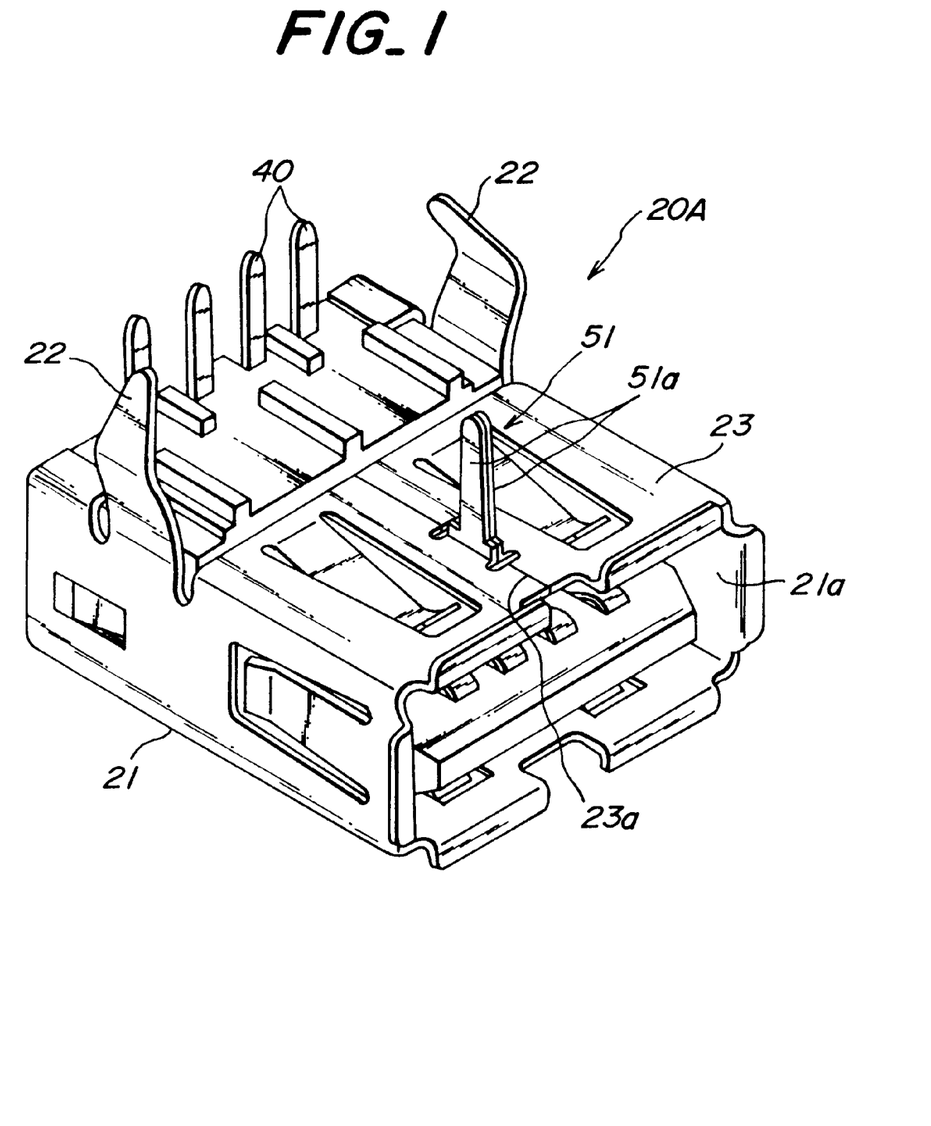
FIG. 1 is an underneath perspective view of one embodiment of the electrical connector according to the invention.

FIG. 1 illustrates one embodiment of the electrical connector according to the invention (corresponding to claim 2). The connector body 20A shown in FIG. 1 is substantially similar to the connector body 20 shown in FIG. 8, with the exception that there is provided an auxiliary leg 51 comprising two extension pieces 51a formed as by punching and extending from butt faces 23a of the shell 21, respectively, substantially at the center of the faces 23a on the side of the mating connector socket 21a with respect to the fixing legs 22 of the shell 21 (on the side of a panel plate of an electrical appliance).

Figure 2:
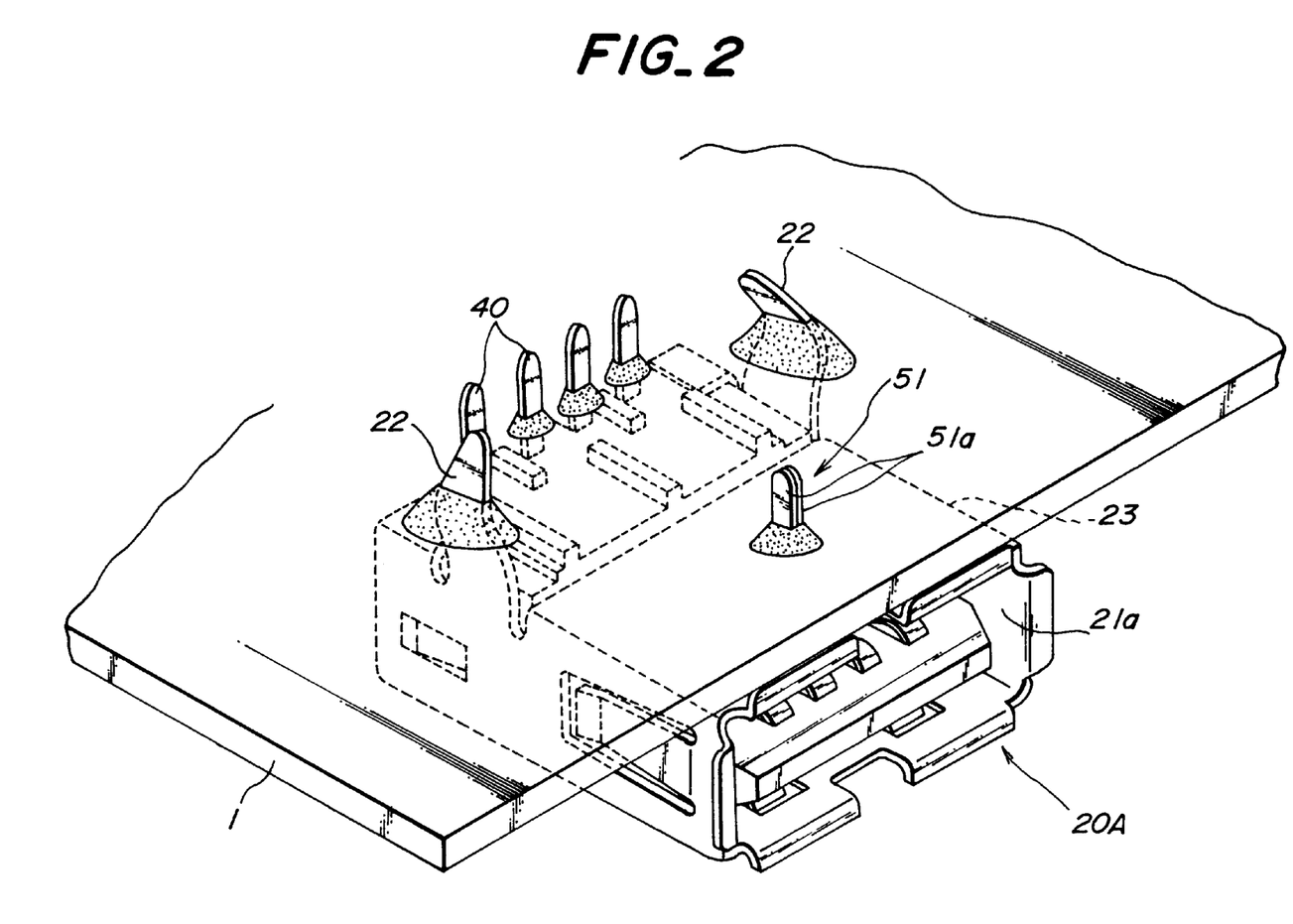
FIG. 2 is an underneath perspective view showing the electrical connector shown in FIG. 1 secured to a circuit board.

In fixing the connector body 20A to a circuit board 1 of an electrical appliance, as shown in FIG. 2 the fixing legs 22 of the shell 21 and protruding terminal legs 40 of contacts are inserted in predetermined fixing apertures (through-holes) of the circuit board 1, and at the same time the auxiliary leg 51 of the shell 21 is also inserted in the corresponding fixing aperture (through-hole) of the circuit board 1 and then these legs are all fixed thereat by soldering.

As a result, the shell 21 is rigidly and stably fixed to the circuit board 1 because of the fixing legs 22 of the shell 21 and the terminal legs 40 of the contacts fixed to the circuit board 1 in the similar manner to in the prior art, and further because of the auxiliary leg 51 of the shell 21 fixed to the circuit board 1 at the intermediate position nearer to the mating connector socket 21a.

Moreover, since the auxiliary leg 51 comprising two extension pieces 51a extending from respective butt faces 23a of the shell 21 substantially at the center of the faces 23a, the separation or opening of the butt faces 23a is substantially completely prevented. In other words, it is possible to effectively prevent the distortion of the rectangular shape of the socket 21a formed as the frame structure 23 in the form of a container.

It is noted that there is no particular restriction as to the position of the auxiliary leg 51 formed on the connector body 20A. While the two extension pieces 51a extend from respective butt faces 23a of the shell 21 substantially at the center of the faces 23a, they may be formed in a staggered relationship without limiting their positions to those shown in FIG. 1.

Figure 3:
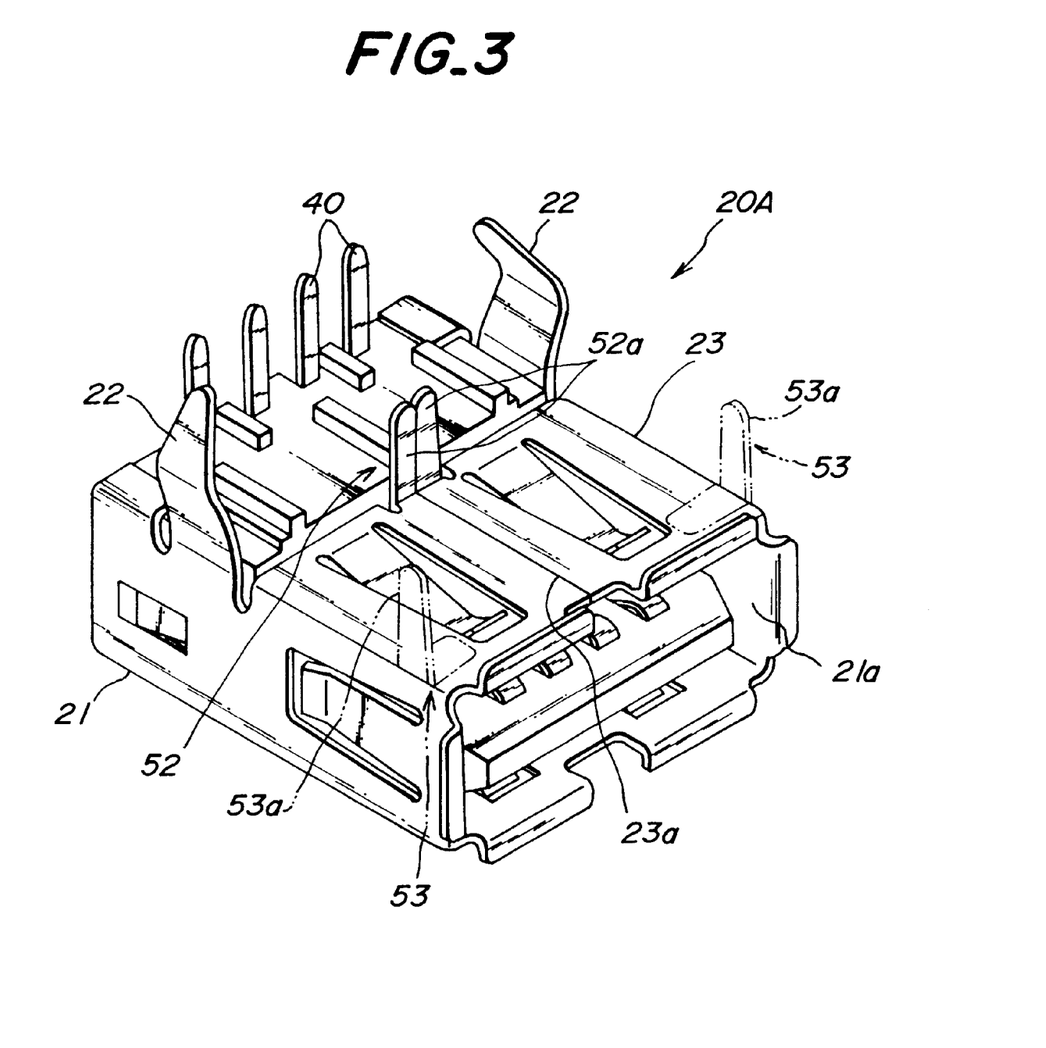
FIG. 3 is an underneath perspective view of another embodiment of the electrical connector according to the invention.

Moreover, as shown in solid lines in FIG. 3, an auxiliary leg 52 may consist of two extension pieces 52a formed as by punching and extending from respective edges of butt faces 23a of the shell 21 remote from the mating connector socket 21a (corresponding to claim 3). In this case, substantially the same effects as the auxiliary leg 51 in FIG. 1 are obtained.

Furthermore, as shown in imaginary lines in FIG. 3, auxiliary legs 53 may consist of two extension pieces 53a formed as by punching and extending from respective side edges of the shell 21 on the side of the mating connector socket 21a with respect to the fixing legs 22 (corresponding to the feature included in claim 1). In this case, although the effect for preventing the butt faces 23a of the shell 21 from separating may be somewhat inferior to those of the above auxiliary legs 51 and 52, the effects substantially similar to those of the auxiliary leg 51 shown in FIG. 1 are fundamentally obtained.

Figure 4:
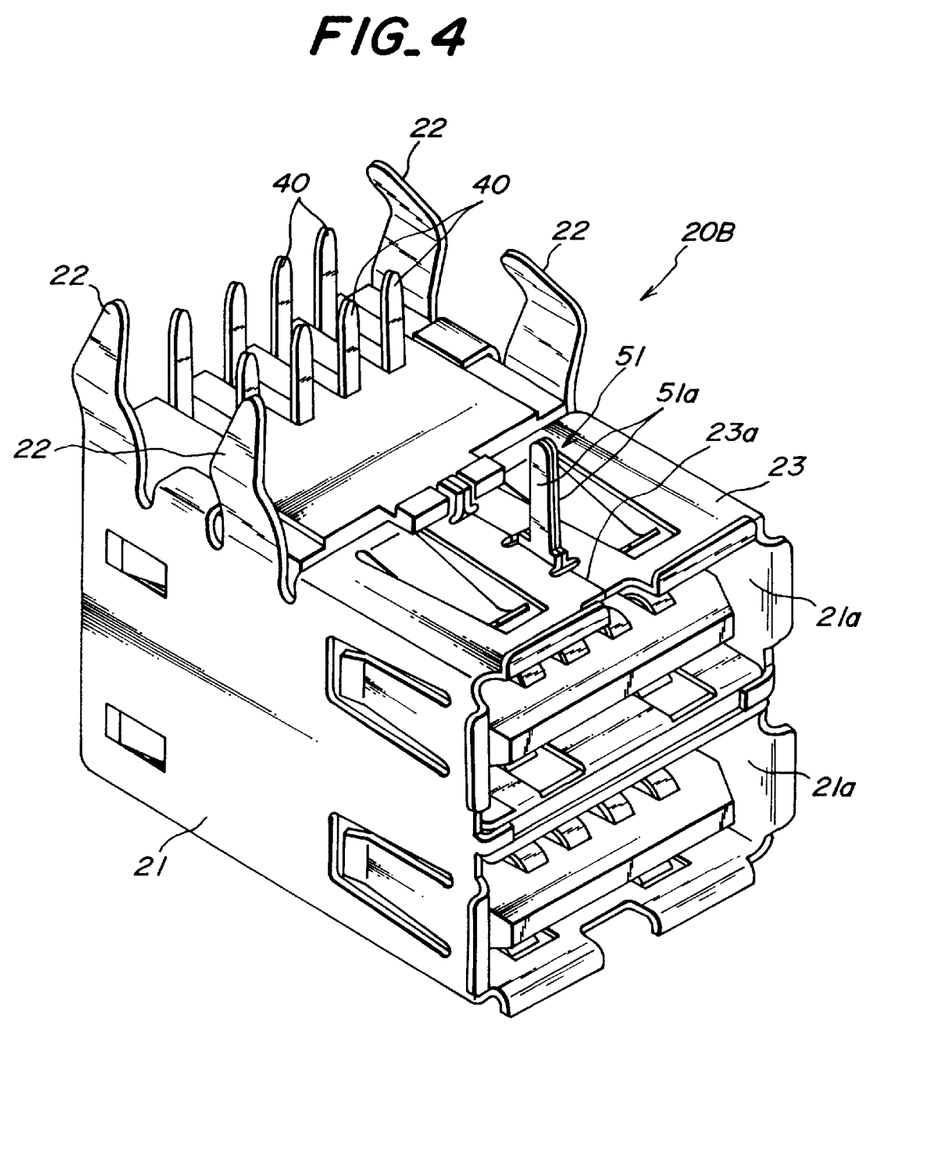
FIG. 4 is an underneath perspective view of a further embodiment of the electrical connector according to the invention.

FIG. 4 illustrates another embodiment of the electrical connector according to the invention (corresponding to claim 2). The connector body 20B of this electrical connector is substantially similar to the connector body 20A shown in FIG. 1, with the exception that two mating connectors can be inserted thereinto one above the other. The auxiliary leg 51 comprises two extension pieces 51a extending from respective butt faces 23a of the shell 21 substantially at the center of the faces 23a so that substantially the same effects as those in FIG. 1 are obtained.

Figure 5:
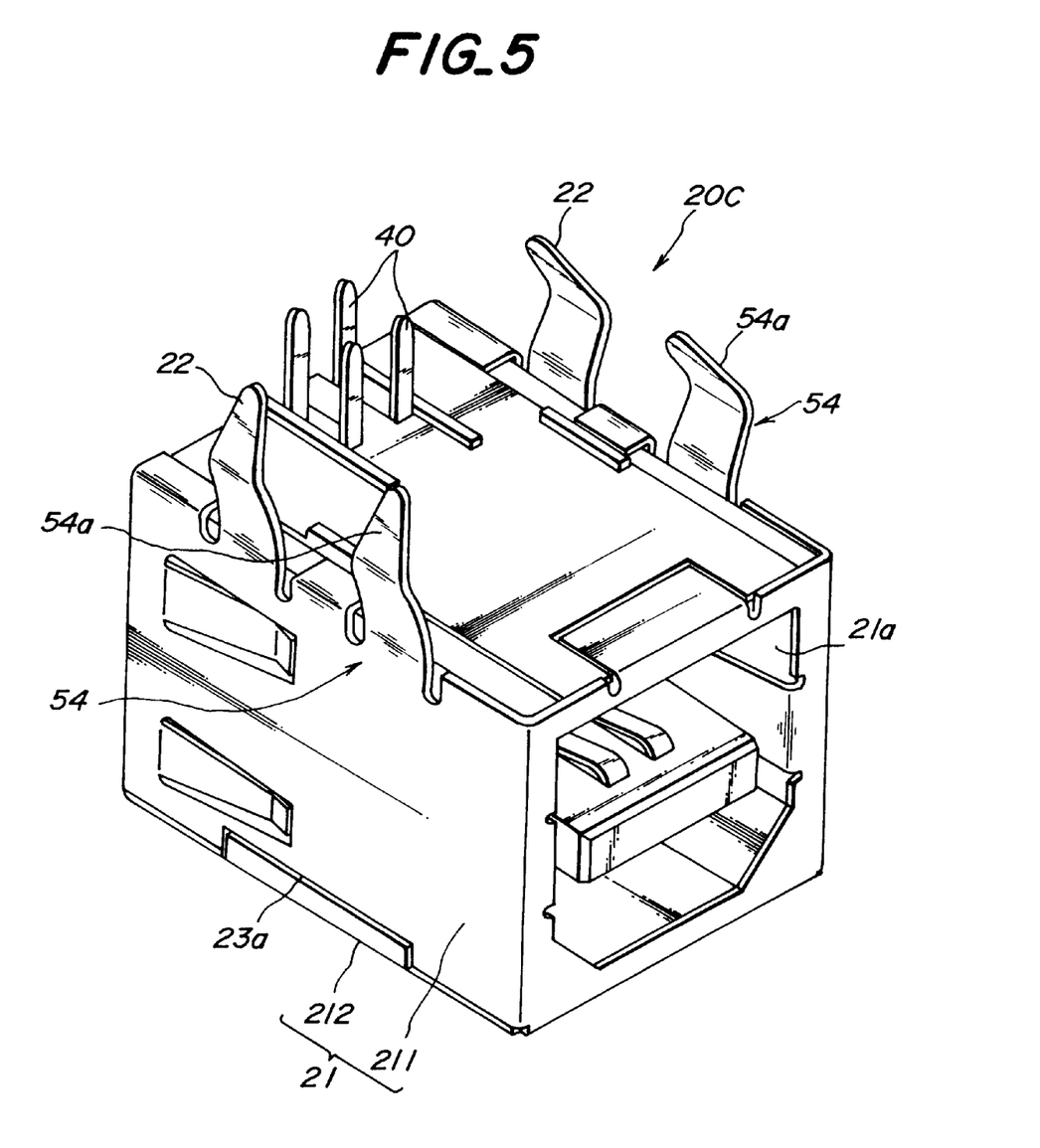
FIG. 5 is an underneath perspective view of an even further embodiment of the electrical connector according to the invention.

FIG. 5 illustrates a further embodiment of the electrical connector according to the invention (corresponding to the feature included in claim 1), whose connector body 20C is different in construction from the connector bodies 20A and 20B. The shell 21 is made of a metallic plate by working which is similar to those of the above connector bodies 20A and 21)B. However, the shell 21 in this embodiment comprises a box-shaped portion 211 covering both side surfaces of the resin-molded body and the mating connector socket 21a and a folded cover 212 covering the upper surface of the resin-molded body, whose butt faces 23a are situated at the center of peripheries on the upper surface and folded onto both the side surfaces, respectively.

In addition to the inherent fixing legs 22 extending from the positions remote from the mating connector socket 21a, there are provided auxiliary legs 54 consisting of extension pieces 54a which are substantially similar in shape to the fixing legs 22 and situated on the side of the mating connector socket 21a with respect to the fixing legs 22. The connector body 20C is also rigidly and stably fixed to a circuit board because of the auxiliary legs 54 provided on the side of the mating connector socket 21a in addition to the inherent fixing legs 22.

In order to ascertain the effects of the invention, the electrical connector 20A according to the invention shown in FIG. 1 and the electrical connector 20 of the prior art having no auxiliary leg shown in FIG. 8 were connected to circuit boards, respectively, under the same conditions and an external force (3 kgf) was applied to both the electrical connectors 20A and 20. As a result, the electrical connector 20A according to the invention remained unaltered without any deformation or distortion, while on the other hand, with the electrical connector 20 of the prior art, its shell was deformed and failures as peelings appeared at the fixing portion between the shell and the circuit board.

While the invention has been particularly shown and described with reference to preferred embodiments thereof, it will be understood by those skilled in the art that the foregoing and other changes in form and details can be made therein without departing from the spirit and scope of the invention.

What is claimed is:

1. An electrical connector including a connector body to be mounted on a circuit board of an electrical appliance by means of protruding terminal legs of contacts incorporated in said connector body and by means of fixing legs of a shell as a worked body of a metallic plate forming an outer casing of said connector body, a mating connector socket of said shell opening outwardly of the electrical appliance, wherein said shell comprises an auxiliary leg to be fixed to said circuit board, said auxiliary leg being formed by extension pieces extending from part of the shell on the side of said mating connector socket with respect to said fixing legs of the shell.

2. An electrical connector including a connector body to be mounted on a circuit board of an electrical appliance by means of protruding terminal legs of contacts incorporated in said connector body and by means of fixing legs of a shell as a worked body of a metallic plate forming an outer casing of said connector body, a mating connector socket of said shell opening outwardly of the electrical appliance, wherein said shell comprises an auxiliary leg to be fixed to said circuit board, said auxiliary leg being formed by two extension pieces extending from respective butt faces of the shell on the side of said mating connector socket with respect to said fixing legs of the shell.

3. An electrical connector including a connector body to be mounted on a circuit board of an electrical appliance by means of protruding terminal legs of contacts incorporated in said connector body and by means of fixing legs of a shell as a worked body of a metallic plate forming an outer casing of said connector body, a mating connector socket of said shell opening outwardly of the electrical appliance, wherein said shell comprises an auxiliary leg to be fixed to said circuit board, said auxiliary leg being formed by extension pieces extending from the proximity of butt faces of the shell on the side of said mating connector socket with respect to said fixing legs of the shell.

4. The electrical connector as set forth in claim 2, wherein said two extension pieces extend from both the butt faces of the shell and arranged in symmetry with respect to said butt faces and in opposite to each other.

5. The electrical connector as set forth in claim 3, wherein said two extension pieces extend from both the butt faces of the shell and arranged in symmetry with respect to said butt faces and in opposite to each other.

* * * * *